US011063069B2

(12) United States Patent
Guan et al.

(10) Patent No.: US 11,063,069 B2
(45) Date of Patent: Jul. 13, 2021

(54) METHOD FOR MANUFACTURING DISPLAY SUBSTRATE (71) Applicant: BOE TECHNOLOGY GROUP CO., LTD., Beijing (CN)

(72) Inventors: Feng Guan, Beijing (CN); Chen Xu, Beijing (CN); Zhi Wang, Beijing (CN); Liwei Liu, Beijing (CN); Lei Chen, Beijing (CN); Xueyong Wang, Beijing (CN); Yan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/577,578

(22) Filed: Sep. 20, 2019

(65) Prior Publication Data

US 2020/0144311 A1 May 7, 2020

(30) Foreign Application Priority Data

Nov. 7, 2018 (CN) .......................... 201811318407.3

(51) Int. Cl.
*H01L 27/12* (2006.01)
*H01L 21/02* (2006.01)

(52) U.S. Cl.
CPC .... *H01L 27/1274* (2013.01); *H01L 21/02675* (2013.01)

(58) Field of Classification Search
CPC ........... H01L 27/1274; H01L 21/02675; H01L 27/1288
See application file for complete search history.

(56) References Cited

U.S. PATENT DOCUMENTS

| 4,752,814 | A | * | 6/1988 | Tuan | ................. H01L 29/78648 |
| | | | | | 257/365 |
| 4,885,616 | A | * | 12/1989 | Ohta | ..................... H01L 29/458 |
| | | | | | 257/59 |
| 6,504,175 | B1 | * | 1/2003 | Mei | ..................... H01L 27/1214 |
| | | | | | 257/66 |

(Continued)

FOREIGN PATENT DOCUMENTS

| CN | 105097453 A | 11/2015 |
| CN | 105870135 A | 8/2016 |
| CN | 108346562 A | 7/2018 |

OTHER PUBLICATIONS

First Office Action dated Mar. 12, 2020 for CN201811318407.3 with English translation attached.

*Primary Examiner* — William Coleman
(74) *Attorney, Agent, or Firm* — Nath, Goldberg & Meyer; Joshua B. Goldberg (57) ABSTRACT A method for manufacturing a display substrate is provided to include: forming an amorphous silicon layer on a base substrate; irradiating at least part of the display region through a mask plate with a laser, to convert a portion of the amorphous silicon layer in the irradiated part of the display region corresponding to channel regions of active layers of transistors into polycrystalline silicon by a laser annealing process; irradiating at least part of the peripheral region with a laser, to convert the amorphous silicon layer in the irradiated part of the peripheral region into polycrystalline silicon; and forming the active layers of the transistors from the amorphous silicon layer which is converted to polycrystalline silicon by a patterning process.

12 Claims, 5 Drawing Sheets

(56) References Cited

U.S. PATENT DOCUMENTS

| | | |
|---|---|---|
| 9,698,279 B2 | 7/2017 | Kim |
| 10,453,876 B2 * | 10/2019 | Nodera ............. H01L 21/02532 |
| 10,777,588 B2 * | 9/2020 | Meng .................... C01F 17/218 |
| 2017/0236705 A1 | 8/2017 | Li et al. |

* cited by examiner

METHOD FOR MANUFACTURING DISPLAY SUBSTRATE

CROSS-REFERENCE TO RELATED APPLICATIONS

The present application claims the priority of the Chinese Patent Application No. 201811318407.3, filed at the China Intellectual Property Office on Nov. 7, 2018, the contents of which are incorporated herein in their entirety by reference.

TECHNICAL FIELD

The present disclosure relates to the field of display technology, and in particular, to a method for manufacturing a display substrate.

BACKGROUND

Low temperature polycrystalline silicon (LTPS) technology refers to a technology in which an amorphous silicon layer is first formed, and it is then converted (crystallized) into polycrystalline silicon by a laser annealing (LA) process. Since low temperature polycrystalline silicon has a comparatively high mobility, a LTPS transistor (e.g., thin film transistor) is applicable to a current-mode light emitting device such as an organic light emitting diode (OLED), for example, applicable to an OLED array substrate.

SUMMARY

According to the present disclosure, there is provided a method for manufacturing a display substrate, which includes: a display region for display and a peripheral region outside the display region and comprising a peripheral circuit, the display region and the peripheral region are both provided with transistors, and the method for manufacturing a display substrate includes: forming an amorphous silicon layer on a base substrate; irradiating at least part of the display region with a laser through a mask plate, to convert a portion of the amorphous silicon layer in the at least part of the display region corresponding to channel regions of active layers of the transistors into polycrystalline silicon by a laser annealing process; irradiating at least part of the peripheral region with a laser, to convert the amorphous silicon layer in the at least part of the peripheral region into polycrystalline silicon; and forming the active layers of the transistors from a part of the amorphous silicon layer which is converted to polycrystalline silicon by a patterning process.

According to some embodiments of the present disclosure, the step of irradiating at least part of the display region with a laser through a mask plate includes: successively irradiating a plurality of first sub-regions in the display region with the laser through the mask plate, each of the plurality of first sub-regions includes at least one of the channel regions of the active layers of the transistors, and each of the channel regions is a region for allowing current to flow between a source and a drain of a transistor when the transistor is turned on.

According to some embodiments of the present disclosure, each of the plurality of first sub-regions has a rectangular shape, and has a length and a width each in a range of 1 mm to 1000 mm, and the width is smaller than or equal to the length.

According to some embodiments of the present disclosure, any two adjacent first sub-regions of the plurality of first sub-regions have a first interval region therebetween, and the first interval region is located between two corresponding channel regions.

According to some embodiments of the present disclosure, the first interval region has a size in a range of 0.001 mm to 10 mm in a direction along which the two first sub-regions adjacent to the first interval region are arranged.

According to some embodiments of the present disclosure, the step of irradiating at least part of the peripheral region with a laser includes: successively irradiating a plurality of second sub-regions in the peripheral region with the laser, each of the plurality of second sub-regions includes a plurality of channel regions of the active layers of the transistors, and each of the plurality of channel regions is a region for allowing current to flow between a source and a drain of a transistor when the transistor is turned on.

According to some embodiments of the present disclosure, each of the plurality of second sub-regions has a rectangular shape, and has a length and a width each in a range of 0.001 mm to 1000 mm, and the width is smaller than or equal to the length.

According to some embodiments of the present disclosure, any two adjacent second sub-regions of the plurality of second sub-regions have a second interval region therebetween, and the second interval region is located between two corresponding channel regions.

According to some embodiments of the present disclosure, the second interval region has a size in a range of 0.001 mm to 10 mm in a direction along which the two second sub-regions adjacent to the second interval region are arranged.

According to some embodiments of the present disclosure, any two adjacent second sub-regions of the plurality of second sub-regions have a first overlapping region which overlaps with the two adjacent second sub-regions, and in a direction along which these any two adjacent second sub-regions are arranged, the first overlapping region has a size smaller than or equal to 50% of a size of the second sub-region.

According to some embodiments of the present disclosure, any two adjacent second sub-regions of the plurality of second sub-regions have a second overlapping region which overlaps with the two adjacent second sub-regions, and in a direction along which these any two adjacent second sub-regions are arranged, the second overlapping region has a size greater than 50% of a size of the second sub-region.

According to some embodiments of the present disclosure, the display substrate includes an array substrate.

According to some embodiments of the present disclosure, the peripheral circuit includes a gate drive circuit.

DETAILED DESCRIPTION

In order to make a person skilled in the art better understand technical solutions of the present disclosure, the present disclosure is described in further detail below in conjunction with the accompanying drawings and specific embodiments.

It can be understood that specific embodiments and accompanying drawings described herein merely serve to interpret the present disclosure, rather than to limit the present disclosure.

It can be understood that, without any contradiction, embodiments and features in the embodiments of the present disclosure may be combined with one another.

It can be understood that, for convenient description, the accompanying drawings of the present disclosure illustrate only the parts relevant to the present disclosure, and parts irrelevant to the present disclosure are not illustrated in the accompanying drawings.

In the present application, "a patterning process" refers to a step of forming a structure having a particular pattern, it may be a photolithography process, which includes one or more steps of forming a material layer, coating photoresist, exposure, development, etching, photoresist lift-off and the like.

Figure 1:
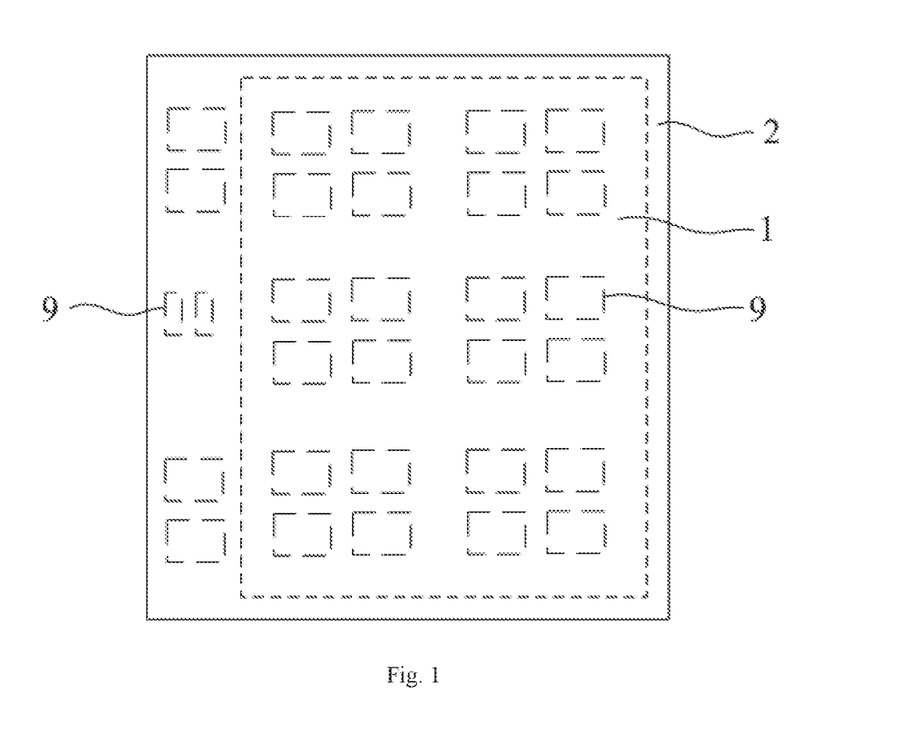
FIG. 1 is a schematic diagram of a structure of a display substrate before being subjected to laser irradiation according to some embodiments of the present disclosure.

FIG. 1 is a schematic diagram of a structure of a display substrate before being subjected to laser irradiation according to some embodiments of the present disclosure. As shown in FIG. 1, in some embodiments, the display substrate includes a display region 1 for display and a peripheral region 2 outside the display region 1 and including a peripheral circuit, and the display region 1 and the peripheral region 2 are both provided with transistors.

Referring to FIG. 1, in some embodiments, the display substrate has the display region 1, and the display region 1 is provided with a pixel circuit for driving a pixel to perform display. The peripheral region 2 is provided outside the display region 1, and the peripheral region 2 is not used for display, but provided with a peripheral circuit for assisting in display. The display region 1 and the peripheral region 2 are both provided with a plurality of transistors (for example, thin film transistors) for constructing a circuit, and are also provided with channel regions 9 of active layers of the transistors, and each of the channel regions 9 refers to a region for allowing current to flow between a source and a drain of a transistor when the transistor is turned on.

In some embodiments, the display substrate is an array substrate. In some embodiments, the peripheral circuit includes a gate driver circuit.

In some embodiments, the display substrate is an array substrate provided with an array of transistors; and in this case, the peripheral circuit may be a gate driver circuit (GOA) for supplying a drive signal directly to a gate line. However, in the present disclosure, types of the display substrate and the peripheral circuit are not limited thereto, as long as the display region 1 and the peripheral region 2 are both provided with transistors.

Figure 2:
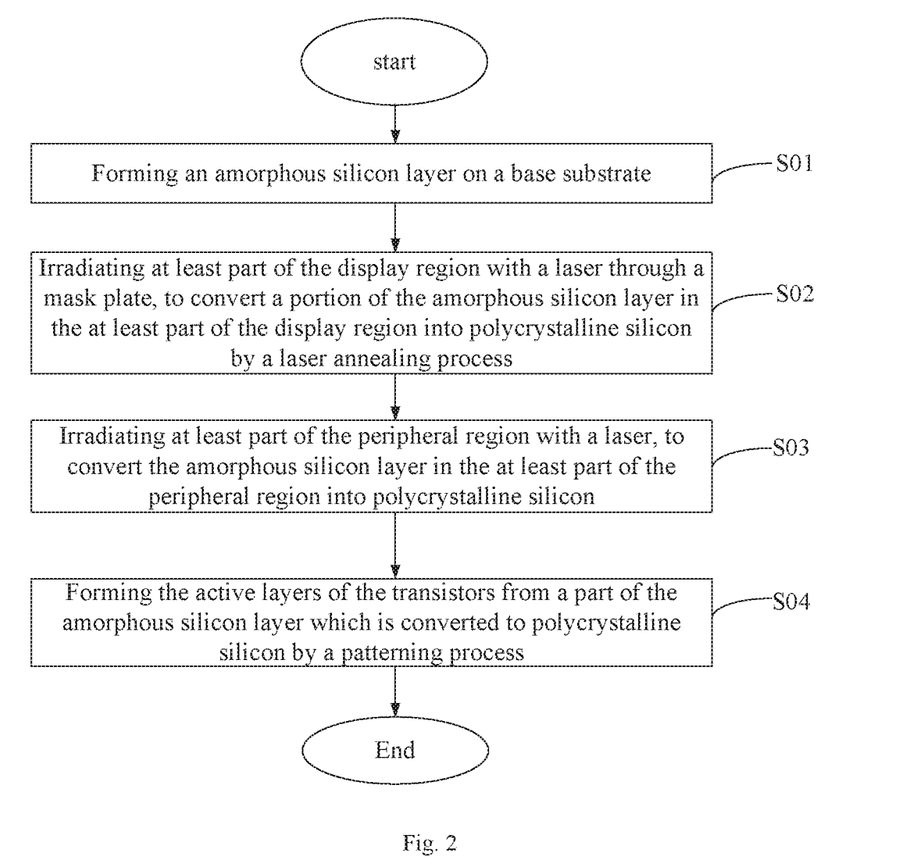
FIG. 2 is a flowchart of a method for manufacturing a display substrate according to some embodiments of the present disclosure.
Figure 3:
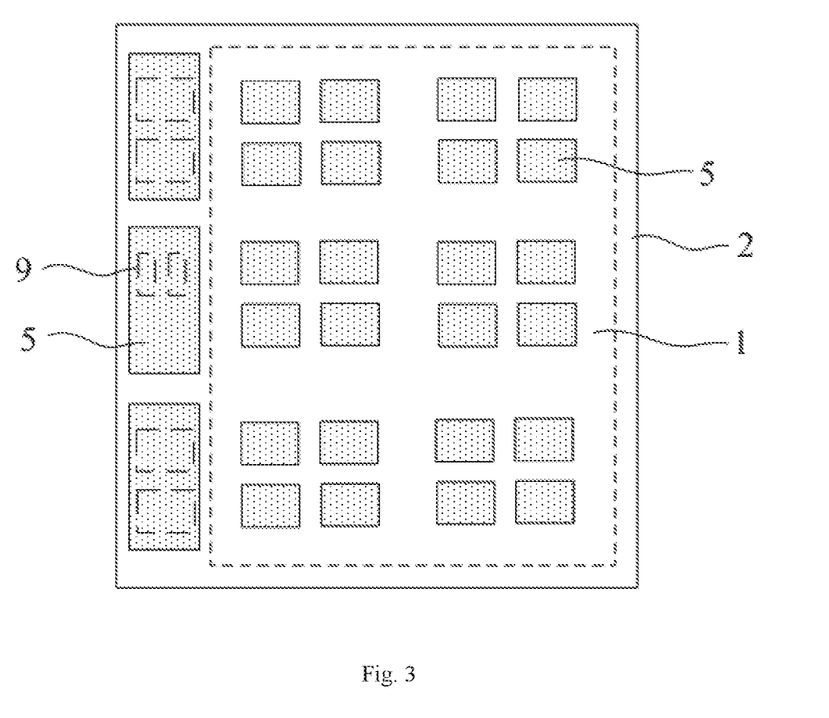
FIG. 3 is a schematic diagram of a structure of a display substrate after being subjected to laser irradiation according to some embodiments of the present disclosure.

FIG. 2 is a flowchart of a method for manufacturing a display substrate according to some embodiments of the present disclosure. FIG. 3 is a schematic diagram of a structure of a display substrate after being subjected to laser irradiation according to some embodiments of the present disclosure. Referring to FIGS. 2 and 3 in conjunction with FIG. 1, in some embodiments, the method for manufacturing a display substrate includes the following steps S01 to S04.

At step S01, an amorphous silicon layer is formed on a base substrate.

At step S02, at least part of the display region 1 is irradiated with a laser through a mask plate, to convert a portion of the amorphous silicon layer in the irradiated part of the display region 1 corresponding to the channel regions 9 of the active layers of the transistors into polycrystalline silicon 5 by a laser annealing process, and each of the channel regions 9 is a region for allowing current to flow between a source and a drain of a transistor when the transistor is turned on.

At step S03, at least part of the peripheral region 2 is irradiated with a laser, to convert the amorphous silicon layer in the irradiated part of the peripheral region 2 into polycrystalline silicon 5.

At step S04, the active layers of the transistors are formed from the part of the amorphous silicon layer which is converted to polycrystalline silicon 5 by a patterning process.

In some embodiments, the laser annealing process may be performed by scan lines in a line scanning manner, so as to convert the entire amorphous silicon layer into polycrystalline silicon. However, since there may be a gap or an overlapping region between different scan lines, polycrystalline silicon formed by this method may have poor uniformity.

Alternatively, a regional laser annealing (or excimer laser annealing, MLA) process may be employed. That is, a part of the amorphous silicon layer within a region is irradiated with a laser through a mask plate, and by designing an opening of the mask plate, it is possible to make only the part of the amorphous silicon layer corresponding to the channel region be subjected to the irradiation and thus be converted into polycrystalline silicon. However, the array substrate includes the display region and the peripheral region, the peripheral region is provided with at least one peripheral circuit such as a gate driver circuit (GOA), and peripheral circuits at different positions in the peripheral region have different structures (that is, channel regions of the transistors at different positions are different), thus the mask plate is required to be frequently changed in the regional laser annealing process to be adapted to various structures of the peripheral circuits, resulting in process complexity, consumption of long time, and low efficiency.

In the method for manufacturing a display substrate according to some embodiments of the present disclosure, an amorphous silicon layer is first formed on a base substrate, and a part of the amorphous silicon layer is then converted (i.e. crystallized) into polycrystalline silicon 5 by a laser annealing process. The laser irradiation on the display region 1 is performed through a mask plate having an opening corresponding to the channel region 9, while the laser irradiation on the peripheral region 2 is performed without a mask plate or by using a mask plate having a large opening (that is, the opening of this mask plate does not exactly correspond to the channel region 9). Thus, the laser irradiation on the peripheral region 2 can be performed using only one mask plate. Thus, as shown in FIG. 3, after the laser irradiation (laser annealing process) finished, in the display region 1 of the display substrate, only a part of the amorphous silicon layer corresponding to the channel region 9 is converted into polycrystalline silicon 5 while in the peripheral region 2, the entire amorphous silicon layer in the irradiated region is converted into polycrystalline silicon 5. That is, in the peripheral region 2, at least part of the amorphous silicon layer, which does not belong to the channel region 9, is converted into polycrystalline silicon 5.

It should be understood that, in steps S02 and S03, the processes of irradiating the display region 1 and the peripheral region 2 may be performed in any order. That is, one of steps S02 and S03 may be performed first and the other may be performed later, or they may be performed alternately.

After the partly converted amorphous silicon layer is obtained, a patterning process (a photolithography process) is performed thereon to remove parts other than the parts corresponding to the active layers of the transistors, so as to form the active layers of the transistors using the polycrystalline silicon 5. At this time, the channel regions 9 in the active regions have already been all converted into polycrystalline silicon 5.

It should be understood that, in some embodiments, the method for manufacturing a display substrate may also include steps of forming other structures such as a buffer layer, a light blocking layer, a gate, a gate line, a gate insulation layer, a source and a drain, a data line, a display structure and the like, which will not be described in further detail herein. In the method for manufacturing a display substrate according to embodiments of the present disclosure, the laser irradiation on the display region 1 is performed through a mask plate having an opening corresponding to the channel region 9, and only a part of the amorphous silicon layer at a position corresponding to the channel region 9 in the display region 1 is converted into polycrystalline silicon 5. Thus, this method is a regional laser annealing (MLA) process, and the obtained polycrystalline silicon 5 has good uniformity. Moreover, since the structures in the display region 1 are highly repetitive, the regional laser annealing process performed on the display region 1 is not required to replace the mask plate frequently, which simplifies the process. Furthermore, when performing the laser irradiation on the peripheral region 2, no mask plate is employed, or a mask plate having a large opening is employed (that is, a mask plate applicable to various circuits may be employed). Thus, there is also no problem of replacing the mask plate, resulting in a simplified process, consumption of short time, and high efficiency.

Figure 4:
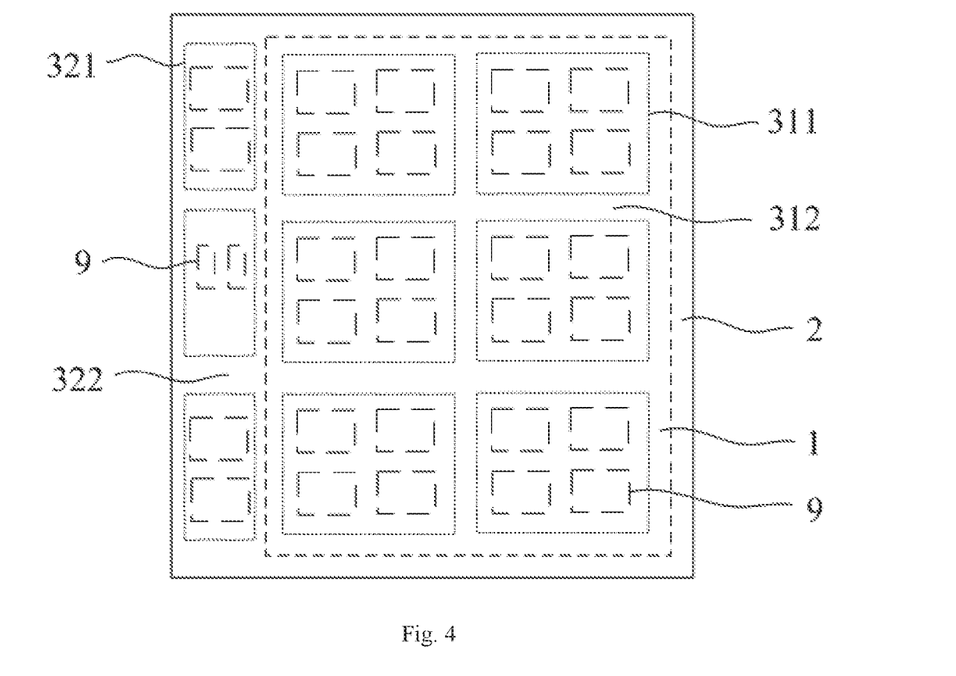
FIG. 4 is a schematic diagram illustrating positions of regions of a display substrate being subjected to laser irradiation according to some embodiments of the present disclosure.

FIG. 4 is a schematic diagram illustrating positions of regions of a display substrate being subjected to laser irradiation according to some embodiments of the present disclosure. Referring to FIG. 4, in some embodiments, the step S02 of irradiating at least part of the display region 1 with a laser through a mask plate may include: successively irradiating a plurality of first sub-regions 311 in the display region 1 with the laser through the mask plate, and each of the first sub-regions 311 includes to one or more channel regions 9 of the active layers of the transistors.

In the regional laser annealing process, due to laser power and the like, the number of regions irradiated in one shot is limited, which cannot cover the entire display region 1, thus multiple shots of irradiation may be performed. Referring to FIG. 4, each shot irradiates one region (i.e. one of the first sub-regions 311) of the display region 1, to perform the laser annealing process on multiple channel regions 9 inside the first sub-region 311. By successive laser irradiation on the plurality of first sub-regions 311, the entire display region 1 may be subjected to the laser annealing process.

In some embodiments, each of the first sub-regions 311 may have a rectangular shape, a length of 1 mm to 1000 mm, and a width of 1 mm to 1000 mm, and the width may be smaller than or equal to the length. In some embodiments, any two adjacent first sub-regions 311 may have a first interval region 312 therebetween, and the first interval region 312 may be located between regions provided with channel regions 9 of the transistors. In some embodiments, the first interval region 312 may have a size of 0.001 mm to 10 mm in a direction along which the two first sub-regions 311 adjacent thereto are arranged.

Referring to FIG. 4, for simplicity and convenience, the first sub-region 311 may be of a rectangular shape with a particular size. In order to guarantee uniformity of the laser annealing process, the first interval region 312 may be provided between two adjacent first sub-regions 311. Since the first interval region 312 is not irradiated, it is kept to be amorphous silicon, thus the first interval region 312 should be provided in a region without the active region of the transistor (for example, a gap region between two rows of pixels or two columns of pixels). The width of the first interval region 312 (that is, a distance between two first sub-regions 311 adjacent thereto) should be in a range of 0.001 mm to 10 mm, to ensure that it is not too wide to affect the arrangement for the transistors, as well as that it is not too narrow to cause two first sub-regions 311 to overlap with each other.

Again referring to FIG. 4, in some embodiments, the step S03 of irradiating at least part of the peripheral region 2 with a laser may include: successively irradiating a plurality of second sub-regions 321 in the peripheral region 2 with the laser, and each of the second sub-regions 321 includes multiple channel regions 9 of the active layers of the transistors.

In some embodiments, the irradiation on the peripheral region 2 may be performed by scan lines in a line scanning manner. However, in order to improve uniformity of the laser annealing process, one of the second sub-regions 321 may be irradiated each time (the second sub-regions 321 may correspond to multiple channel regions 9), to convert the amorphous silicon layer in this second sub-region 321 into polycrystalline silicon 5. By successive irradiation of the plurality of second sub-regions 321, the entire peripheral region 2 may be subjected to the laser annealing process.

In some embodiments, to ensure neat alignment of edges of the irradiated regions, a mask plate may be used during the irradiation. However, each opening of the mask plate should be large enough to correspond to one of the second sub-regions 321 (that is, correspond to multiple channel regions 9). In this case, each opening of the mask plate corresponds to multiple channel regions 9, rather than exactly to a single channel region 9. Thus, even for different circuits, a same mask plate may be employed, and it is unnecessary to replace the mask plate for the different circuits.

In some embodiments, each of the second sub-regions 321 may have a rectangular shape, a length of 0.001 mm to 1000 mm, a width of 0.001 mm to 1000 mm, and the width may be smaller than or equal to the length.

In some embodiments, any two adjacent second sub-regions 321 may have a second interval region 322 therebetween, and the second interval region 322 may be located between regions provided with channel regions of the transistors. In some embodiments, the second interval region 322 may have a size of 0.001 mm to 10 mm in a direction along which the two second sub-regions 321 adjacent thereto are arranged.

Figure 5:
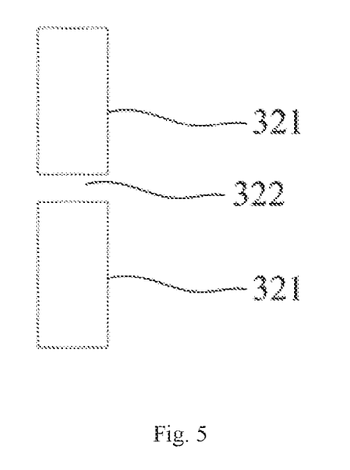
FIG. 5 is a schematic diagram illustrating a positional relationship between two second sub-regions in a method for manufacturing a display substrate according to some embodiments of the present disclosure.

FIG. 5 is a schematic diagram illustrating a positional relationship between two second sub-regions in a method for manufacturing a display substrate according to some embodiments of the present disclosure.

Referring to FIG. 5, in some embodiments, there may be a small interval (that is, the second interval region 322) between two adjacent second sub-regions 321. The amorphous silicon layer in the second interval region 322 is not converted into polycrystalline silicon, and the amorphous silicon layer inside regions of tens of microns in the second sub-regions 321 that are most proximal to the second interval region 322 may have non-uniform crystallization (caused by non-uniform distribution of heat). In this case, it is necessary to design a peripheral circuit (for example, a gate drive circuit), to ensure that there is no channel region for a transistor in the second interval region 322. Thus, the width size of the second interval region 322 (that is, a distance between two adjacent second sub-regions 321) should be in a range of 0.001 mm to 10 mm, to guarantee design reliability of the peripheral circuit.

Figure 6:
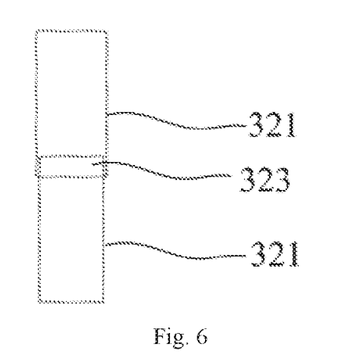
FIG. 6 is a schematic diagram illustrating a positional relationship between two second sub-regions in a method for manufacturing a display substrate according to some embodiments of the present disclosure.

FIG. 6 is a schematic diagram illustrating a positional relationship between two second sub-regions in a method for manufacturing a display substrate according to some embodiments of the present disclosure.

Referring to FIG. 6, in some embodiments, any two adjacent second sub-regions 321 may have a first overlapping region 323 therebetween. In a direction along which these two adjacent second sub-regions 321 are arranged, the size of the first overlapping region 323 may be smaller than or equal to 50% of the size of the second sub-region 321, the first overlapping region 323 is located between regions provided with the channel regions. In this case, the amorphous silicon layer in the first overlapping region 323 will be subjected to two shots of irradiation, resulting in a different crystallization than the amorphous silicon layer in other regions of the second sub-regions 321. Thus, there should be no channel region in the first overlapping region 323.

Figure 7:
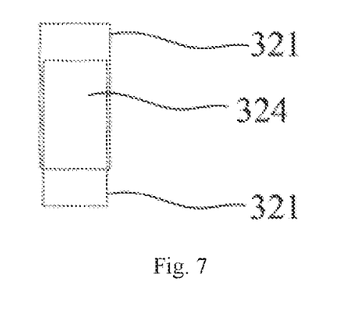
FIG. 7 is a schematic diagram illustrating a positional relationship between two second sub-regions in a method for manufacturing a display substrate according to some embodiments of the present disclosure.

FIG. 7 is a schematic diagram illustrating a positional relationship between two second sub-regions in a method for manufacturing a display substrate according to some embodiments of the present disclosure.

Referring to FIG. 7, in some embodiments, any two adjacent second sub-regions 321 may have a second overlapping region 324 therebetween. In a direction along which these two adjacent second sub-regions 321 are arranged, the size of the second overlapping region 324 may be greater than 50% of the size of the second sub-region 321. In this case, each second sub-region 321 overlaps with multiple other second sub-regions 321, and the majority of the second sub-region 321 will be subjected to multiple shots of irradiation. By setting parameters (for example, power, time, etc.) of each shot of irradiation, the amorphous silicon layer can be converted into appropriate polycrystalline silicon 5 after being irradiated by multiple shots. That is, the process is similar to the excimer laser annealing (ELA) process. In this case, each position in the second sub-region 321 goes through substantially the same number of irradiation shots, thus, each second sub-region 321 does not have non-uniform crystallization, and a transistor may be provided at any position in the second sub-region 321.

It should be understood that, the above embodiments are only exemplary embodiments for the purpose of explaining the principle of the present disclosure, and the present disclosure is not limited thereto. For a person skilled in the art, various improvements and modifications may be made without departing from the spirit and essence of the present disclosure. These improvements and modifications also fall within the protection scope of the present disclosure.

What is claimed is:

1. A method for manufacturing a display substrate, which comprises: a display region for display, and a peripheral region outside the display region and comprising a peripheral circuit, wherein, the display region and the peripheral region comprise transistors, and the method for manufacturing a display substrate comprises:
    forming an amorphous silicon layer on a base substrate;
    irradiating at least part of the display region with a laser through a mask plate, to only convert a portion of the amorphous silicon layer in the at least part of the display region corresponding to channel regions of active layers of the transistors into polycrystalline silicon by a regional laser annealing process;
    irradiating at least part of the peripheral region with a laser, to convert all the amorphous silicon layer in the at least part of the peripheral region into polycrystalline silicon; and
    forming the active layers of the transistors from a part of the amorphous silicon layer which is converted to polycrystalline silicon by a patterning process;
    wherein the irradiating at least part of the display region with a laser through a mask plate comprises:
    successively irradiating a plurality of first sub-regions in the display region with the laser through the mask plate, wherein each of the plurality of first sub-regions corresponds to one of the channel regions of the active layers of the transistors, and
    wherein, each of the channel regions is a region for allowing current to flow between a source and a drain of a transistor when the transistor is turned on.

2. The method for manufacturing a display substrate according to claim 1, wherein
    each of the plurality of first sub-regions has a rectangular shape, and has a length and a width each in a range of 1 mm to 1000 mm, and the width is smaller than or equal to the length.

3. The method for manufacturing a display substrate according to claim 1, wherein the irradiating at least part of the peripheral region with a laser comprises:
    successively irradiating a plurality of second sub-regions in the peripheral region with the laser, wherein each of the plurality of second sub-regions comprises channel regions of the active layers of the transistors,
    wherein, each of the channel regions is a region for allowing current to flow between a source and a drain of a transistor when the transistor is turned on.

4. The method for manufacturing a display substrate according to claim 1, wherein
    the display substrate comprises an array substrate.

5. The method for manufacturing a display substrate according to claim 2, wherein
    any two adjacent first sub-regions of the plurality of first sub-regions have a first interval region therebetween, and the first interval region is located between two corresponding channel regions.

6. The method for manufacturing a display substrate according to claim 5, wherein
    the first interval region has a size in a range of 0.001 mm to 10 mm in a direction along which the two first sub-regions adjacent to the first interval region are arranged.

7. The method for manufacturing a display substrate according to claim 3, wherein
each of the plurality of second sub-regions has a rectangular shape, and has a length and a width each in a range of 0.001 mm to 1000 mm, and the width is smaller than or equal to the length.

8. The method for manufacturing a display substrate according to claim 7, wherein
any two adjacent second sub-regions of the plurality of second sub-regions have a second interval region therebetween, and the second interval region is located between two corresponding channel regions.

9. The method for manufacturing a display substrate according to claim 7, wherein
any two adjacent second sub-regions of the plurality of second sub-regions have a first overlapping region which overlaps with the two adjacent second sub-regions, and
wherein, in a direction along which the two adjacent second sub-regions are arranged, the first overlapping region has a size smaller than or equal to 50% of a size of the second sub-region.

10. The method for manufacturing a display substrate according to claim 7, wherein
any two adjacent second sub-regions of the plurality of second sub-regions have a second overlapping region which overlaps with the two adjacent second sub-regions, and
wherein, in a direction along which the two adjacent second sub-regions are arranged, the second overlapping region has a size greater than 50% of a size of the second sub-region.

11. The method for manufacturing a display substrate according to claim 8, wherein
the second interval region has a size in a range of 0.001 mm to 10 mm in a direction along which the two second sub-regions adjacent to the second interval region are arranged.

12. The method for manufacturing a display substrate according to claim 4, wherein
the peripheral circuit comprises a gate driver circuit.

* * * * *